United States Patent [19]

Bingham

[11] 4,295,105

[45] Oct. 13, 1981

[54] SWITCHED-CAPACITOR MODULATOR

[75] Inventor: John A. C. Bingham, Palo Alto, Calif.

[73] Assignee: Racal-Vadic, Inc., Sunnyvale, Calif.

[21] Appl. No.: 119,374

[22] Filed: Feb. 7, 1980

[51] Int. Cl.³ .......................... H03C 1/02; H03K 7/00
[52] U.S. Cl. ................... 332/9 R; 332/31 R; 332/37 R
[58] Field of Search ...................... 332/9 R, 9 T, 31 R, 332/31 T, 37 R, 44, 45; 455/108, 109; 375/41, 43, 61

[56] References Cited

U.S. PATENT DOCUMENTS

| | | | |
|---|---|---|---|
| 3,384,838 | 5/1968 | Knutrud | 332/9 T |
| 3,411,110 | 11/1968 | Walker | 332/44 |
| 3,604,947 | 9/1971 | Puthuff | 332/31 T X |
| 3,937,882 | 2/1976 | Bingham | 370/24 |

Primary Examiner—Siegfried H. Grimm
Attorney, Agent, or Firm—Harvey G. Lowhurst

[57] ABSTRACT

Novel apparatus and techniques for the modulation of a signal from one frequency band to another frequency band are disclosed. An integrator is changed between the inverting and non inverting modes, each mode occurring with each half cycle of a carrier signal. The modulating signal is sampled and applied to the integrator to provide the modulated signal. The modulator circuit components are fully suitable for fabrication on a single substrate.

8 Claims, 11 Drawing Figures

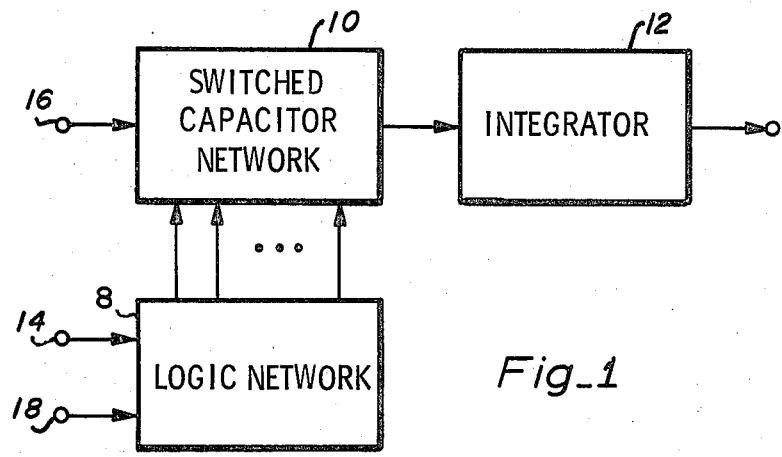
Fig_1
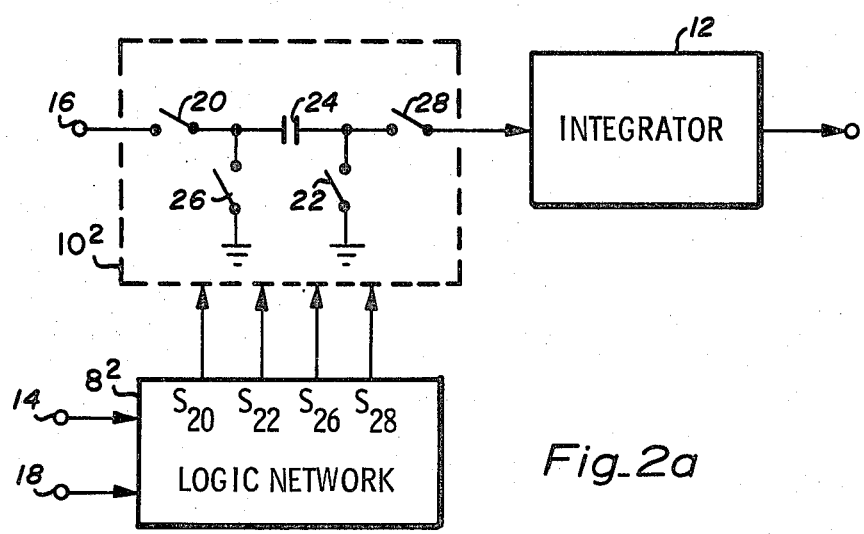
Fig_2a
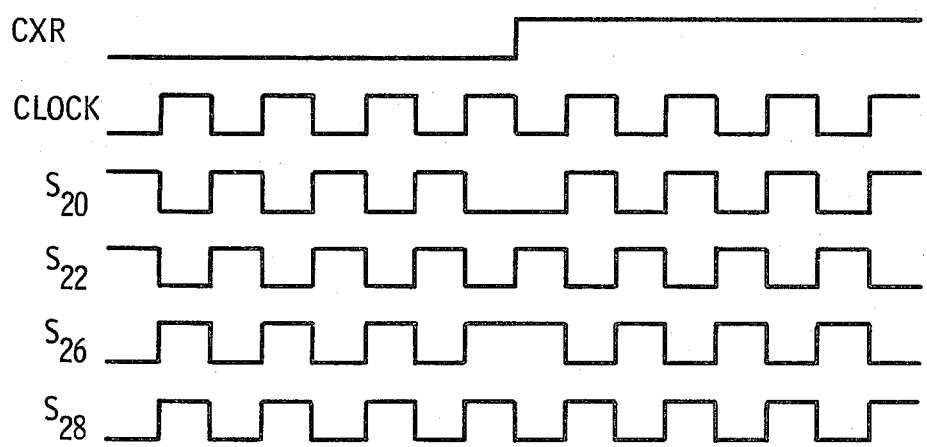
Fig_2b

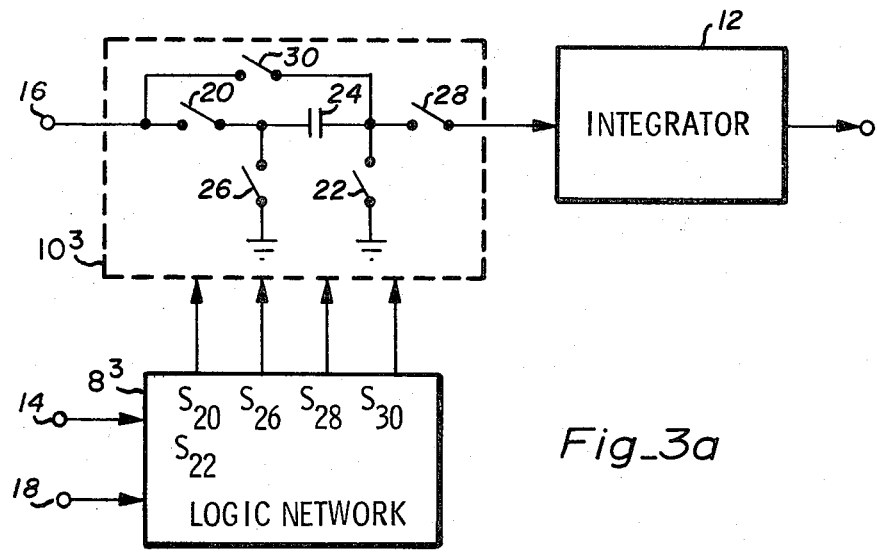
Fig_3a
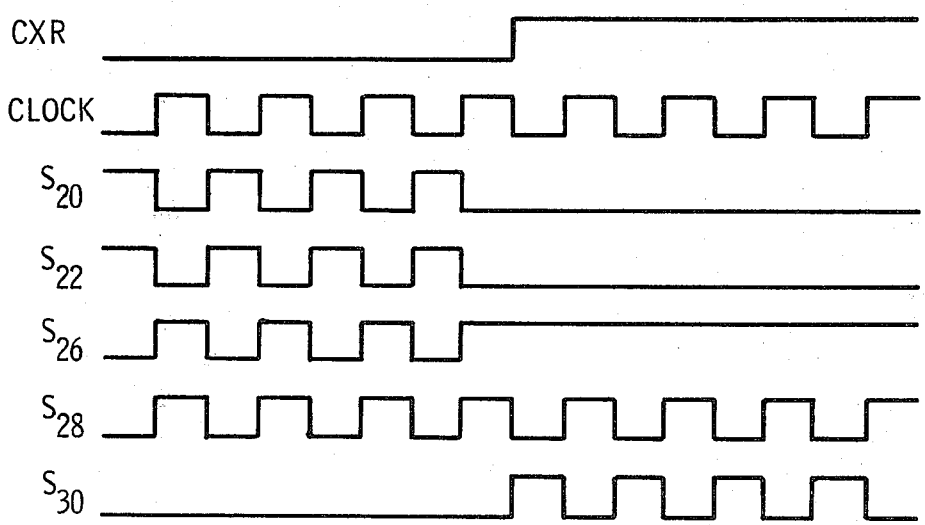
Fig_3b

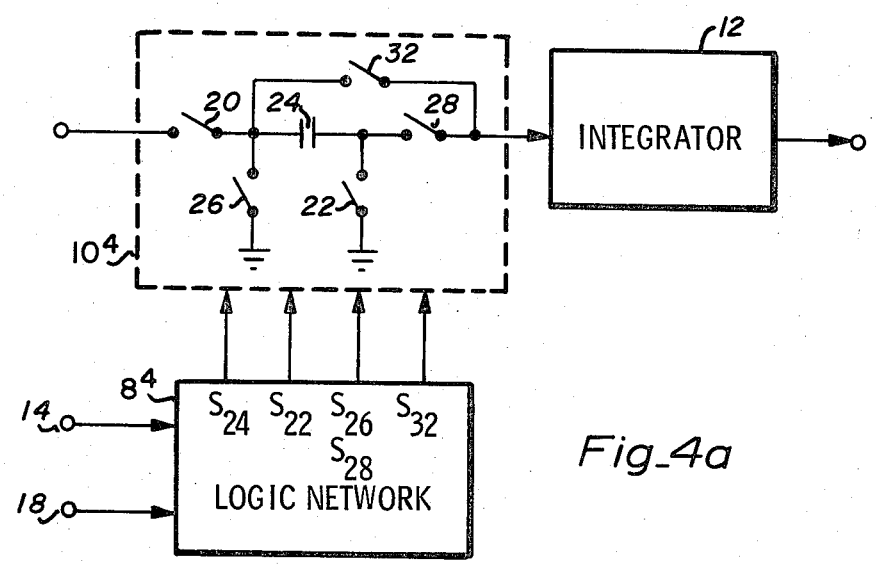
Fig_4a
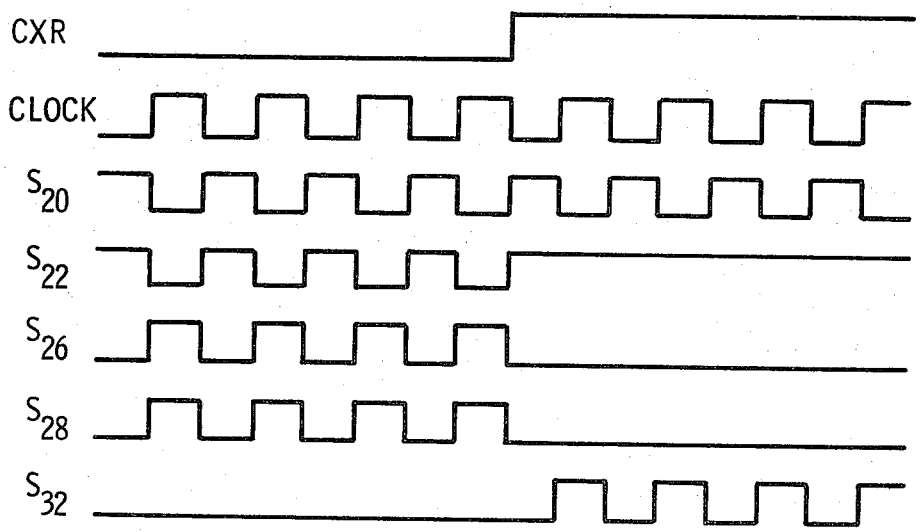
Fig_4b

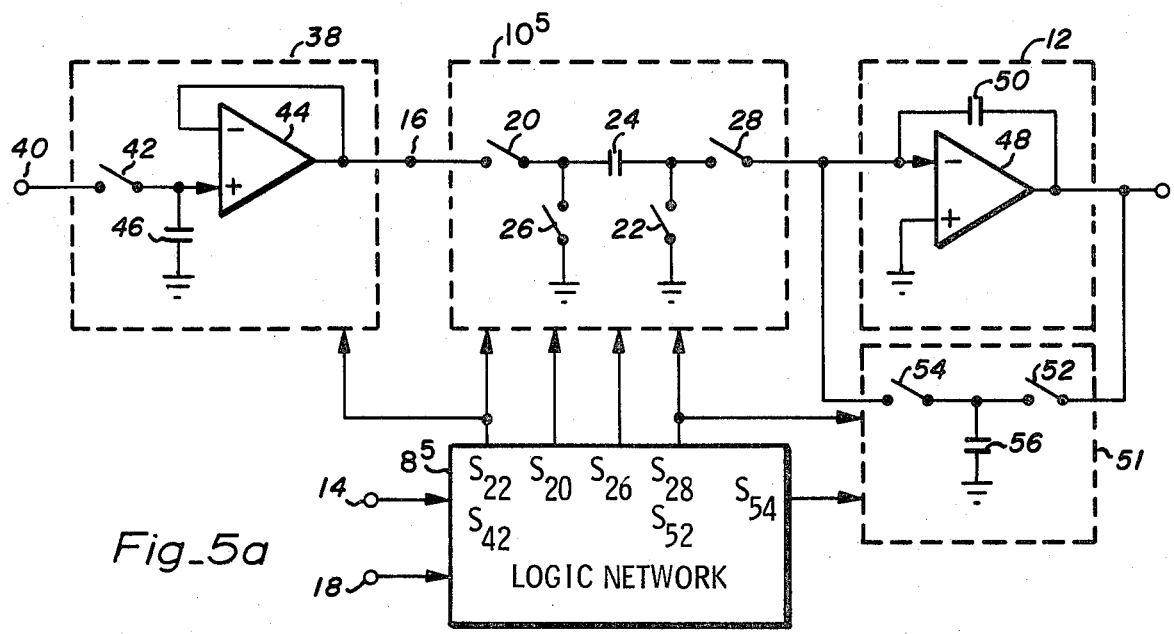
Fig_5a
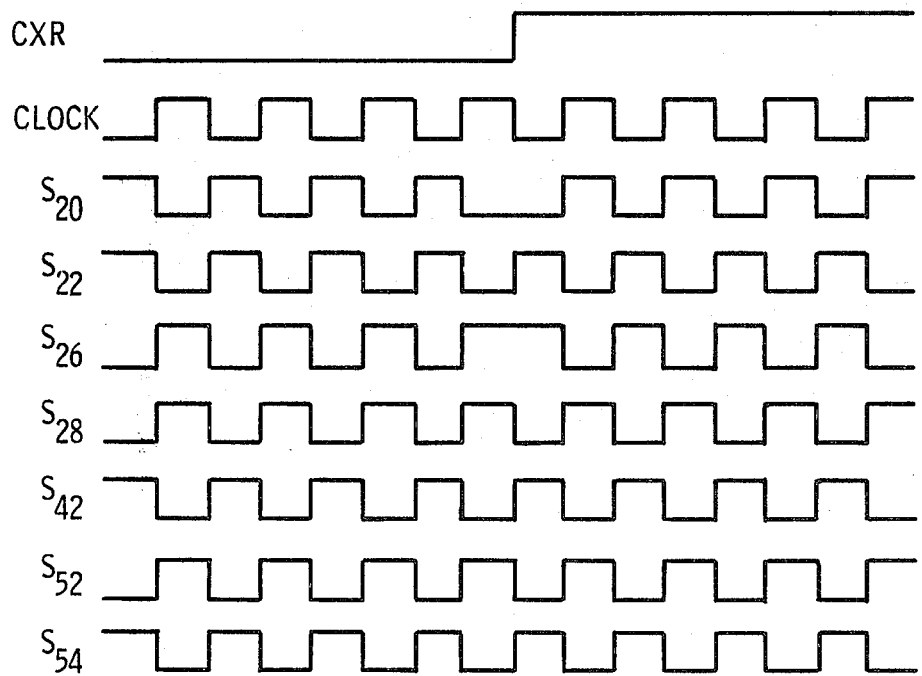
Fig_5b

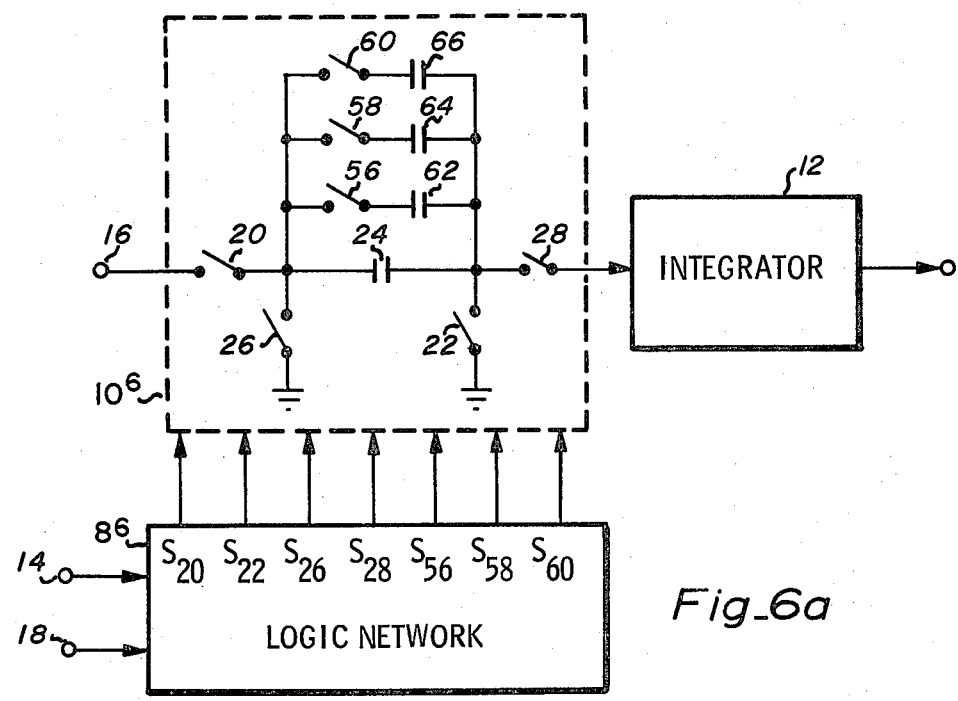
Fig_6a
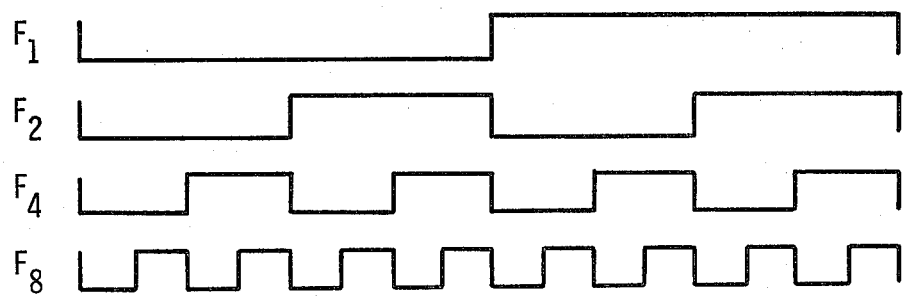
Fig_6b

SWITCHED-CAPACITOR MODULATOR

BACKGROUND OF THE INVENTION

The present invention relates generally to the modulation of a signal from one frequency band to another frequency band by multiplying such signal by another signal with a simple wave form which is generally sinusoidal or square.

Modulators have previously been implemented using various types of non-linear devices, such as vacuum tubes, diodes, transistors and switches in combination with either transformers or amplifiers. A typical modulator has been disclosed in U.S. Pat. No. 3,937,882 (Bingham) issued Feb. 10, 1976. Should the design application require that all spurious outputs of a modulator be suppressed to a very low level, individual adjustment of circuit parameters generally has been necessary.

It is often very desirable that electronic network transfer functions be realized using only those components which can be fabricated in large scale integrated circuits. One set of such components comprises switches, capacitors and operational amplifiers. The technology for using these components has become known as switched-capacitor technology and has been described by Hosticka and others in the IEEE Journal of Solid State Circuits, December 1977, page 600.

The transfer functions of switched-capacitor circuits have been shown to be sensitive to the stray capacitances from each plate of the capacitor to the common ground, usually the substrate. The larger of the stray capacitances occurs between the bottom plate of the capacitor and the grounded substrate. However, this stray capacitance can generally be rendered harmless by configuring the circuits so that the bottom plate of the capacitor is connected to the grounded substrate. This configuration will still exhibit circuit sensitivity to the smaller of the stray capacitances occurring between the top plate of the capacitor and the grounded substrate.

Two implementations of switched-capacitor integrators, which are completely insensitive to both of the aforementioned stray capacitances, have been described by Martin and Sedra in Electronics Letters, June 21, 1979, page 365. A complementary pair of inverting and non-inverting integrators was disclosed therein, as well as circuit implementations for various filter sections.

SUMMARY OF THE INVENTION

Accordingly, it is an important object of the present invention to provide a modulator that may be fully integrated and not require the use of discrete components.

It is a further object of the present invention to realize the implementation of such a modulator by using switches, capacitors and operational amplifiers.

It is a further object of the present invention to provide a modulator where a modulating signal is applied to an integrator which is alternately operated in the inverting and non-inverting mode under the control of a carrier signal.

It is a further object of the present invention to provide a modulator wherein the output balance between the inverting and non-inverting mode of operation is independent of the matching of circuit components.

It is a further object of the present invention to provide a modulator which is insensitive to the inherent stray capacitances associated with integrated capacitors.

According to the invention, there is an integrator which is changed between the inverting and non-inverting modes under the control of the carrier signal. The incoming, or modulating, signal is applied to said integrator through the switched-capacitor network. The components used in the circuit design of the integrator and switched-capacitor network are fully suitable for implementation into a large scale integrated circuit.

A feature of the present invention is a modulator which comprises a single operational amplifier with a feedback capacitor (the integrator) and one or more input capacitors which are switched between the incoming signal and integrator, applying either the input signal, or the negative thereof, to the integrator. The output signal of the integrator is equivalent to the carrier signal modulated by the incoming signal.

Several embodiments of the present invention are hereinafter described which accomplish one or more of the preceding objects. Numerous other features, objects and advantages of the present invention will become apparent from the following specification when read in connection with the accompanying drawings.

BRIEF DESCRIPTION OF THE DRAWINGS

FIG. 1 is a schematic block diagram illustrating the modulating system;

FIG. 2a is a circuit diagram showing details of the basic embodiment of the switched-capacitor network of FIG. 1;

FIG. 2b is a timing diagram of the logic of one embodiment to activate the switches of FIG. 2a;

FIG. 3a is a circuit diagram showing an alternate embodiment of the switched-capacitor network of FIG. 2a;

FIG. 3b is a timing diagram of the logic of one embodiment to activate the switches of FIG. 3a;

FIG. 4a is a circuit diagram showing another embodiment of the switched-capacitor network of FIG. 1;

FIG. 4b is a timing diagram of the logic of one embodiment to activate the switches of FIG. 4a;

FIG. 5a is a circuit diagram showing still another embodiment of the switched-capacitor network of FIG. 1;

FIG. 5b is a timing diagram of the logic of one embodiment to activate the switches of FIG. 5a;

FIG. 6a is a circuit diagram showing still another embodiment of the switched-capacitor network of FIG. 1; and FIG. 6b is a timing diagram of the logic of one embodiment to activate the switches of FIG. 6a.

DETAILED DESCRIPTION OF THE DRAWINGS

FIG. 1 shows a block diagram illustrating the modulating system comprising the logic network 8, the switched-capacitor network 10 and the integrator 12. A clock signal is applied to the logic network 8 at input 14 to provide the basic means of sampling the modulating signal which is applied at input 16 of the switched-capacitor network 10. The carrier signal is applied at input 18 of the logic network 8, and the state of the carrier signal determines whether the sampled modulating signal or the negative thereof is applied to the integrator 12, which generates an output signal equivalent to the carrier signal modulated by the modulating signal. The logic network 8 generates switching signals applied to the switched-capacitor network 10 to effect the aforementioned application of the modulating signal to the integrator 12. In the preferred embodiment of the present invention, the modulating system of FIG. 1 comprises only those circuit components that are easily fabricated with large scaled integrated technology. The switches may be common MOSFET integrated circuits and the integrator may be of common design comprising an operational amplifier with a feedback capacitor, all of which may be integrated on a single substrate. Preferably, no discrete components are utilized in the realization of the present invention.

FIG. 2a shows a basic embodiment of the switched-capacitor network 12 of FIG. 1. During a selected first one-half time period of the carrier signal, switch 20 and switch 22 operate in phase and close to charge capacitor 24. Switch 20 and switch 22 then open and switch 26 and switch 28 close to discharge the capacitor into the integrator 12. The sampling of the modulating signal in this mode of operation applies the sampled negative of the modulating signal to the integrator 12. When the integrator 12 is realized as an inverting amplifier with a feedback capacitor, the overall modulating system operates in the non-inverting mode.

During the second one-half time period of the carrier signal, switch 20 and switch 28 are operated in phase and close to charge capacitor 24 applying the sampled modulating signal directly to the integrator 12. Switch 20 and switch 28 then open and switch 22 and switch 26 close to discharge capacitor 24 into ground. When the integrator is realized as above, the overall modulating system operates in the inverting mode. The change of mode of operation under the control of the carrier signal effects the modulation.

The logic network 8 generates switching signals to effect the operation of the switches in the switched-capacitor network 10. The preferred logical representation of the switching signals, $S_n$, where n is the reference number of the respective switch illustrated in FIG. 2a, is as follows:

$S_{20} = \overline{CLOCK \oplus CXR}$
$S_{22} = \overline{CLOCK}$
$S_{26} = CLOCK \oplus CXR$
$S_{28} = CLOCK$ where CLOCK and CXR refer to the logic levels of the clock and carrier signals, respectively.

No phase or frequency relationship between the clock and carrier signals is required, but serious aliassing distortion may occur if the frequency of the clock signal is less than eight times the frequency of the carrier signal.

In the preferred embodiment of the present invention, the frequency of the clock signal is a power of 2 multiple of the frequency of the carrier signal, and the multiple should be at least 4. FIG. 2b shows one of the preferred relationships between the carrier signal, clock signal and the switching signals as hereinabove described.

When the above described modulator operates in the non-inverting mode, the first half time period of the clock signal causes the charging of capacitor 24 whereas the second half of the clock signal causes the discharging of capacitor 24 into the integrator 12; the modulating signal as applied to integrator 12 is thus delayed for one-half the time period of the clock signal. However, during the inverting mode, the modulating signal is applied through capacitor 24 to the integrator 12 without any time delay. This imbalance generates a spurious component in the output signal.

The above described imbalance can be compensated for by the switched capacitor network of FIG. 3a, which shows the basic embodiment of the switched capacitor network with an added switch.

During a selected first one-half time period of the carrier signal, switch 30 remains open, and the remainder of the switching network operates as described in reference to the noninverting mode of the network of FIG. 2a.

However, during the remaining one-half time period of the carrier signal, switch 20 and switch 22 remain open and switch 26 remains closed. The first half time period of the clock signal closes switch 30 to charge capacitor 24 through switch 26. The second half time period of the clock signal opens switch 30 and closes switch 28 to discharge capacitor 24 into the integrator 14. The inverting mode is thus also realized with the above described time delay and the imbalance is corrected.

The above described relationships between the frequencies of the clock and carrier signals associated with the network of FIG. 2a are also valid with respect to FIG. 3a, but the timing of the individual switching signals is different.

The logic network $8^3$ generates switching signals to effect the operation of the switches in the switched-capacitor network $10^3$. The preferred logical representation of the switching signals, $S_n$, where n is the reference number of the respective switch illustrated in FIG. 3a, is as follows:

$S_{20} = S_{22} = \overline{CLOCK \cdot CXR}$
$S_{26} = CLOCK + CXR$
$S_{28} = CLOCK$
$S_{30} = \overline{CLOCK} \cdot CXR$ where CLOCK and CXR are defined above.

FIG. 3b shows one of the preferred relationships between the carrier signal, clock signal and the switching signals hereinabove described in reference to FIG. 3a.

FIG. 4a shows a complementary embodiment of the modulating system of FIG. 3a, therefore, the mode of operation need not be fully described. Switch 32 is the complement of switch 30 of FIG. 3a. However, so that one skilled in the art may fully understand the operation of the system of FIG. 4a, one of the preferred relationships between the carrier signal, clock signal and switching signals are shown in FIG. 4b.

When the network of FIG. 3a (or 4a) is realized as an integrated circuit a stray capacitance between the substrate and that plate of capacitor 24 which is connected with switches 22, 28 and 30 (or 20, 26 and 32) has the effect of increasing the gain of the integrator 12 in the inverting mode but has no effect upon the gain in the non-inverting mode. This imbalance may cause small spurious components in the output generated by the integrator 12.

The effect of the stray capacitance can be eliminated by using the network of FIG. 2a which is insensitive to stray capacitances, and providing delay means operative during the inverting mode to delay the modulating signal for one-half the time period of the switching signal before the same is applied to the integrator 12.

FIG. 5a shows the switched-capacitor network $10^2$ of FIG. 2a with the added delay means 38; the modulating signal is now applied to input 40. Switch 42 operates in phase with switch 22. During the previously described first one-half period of the carrier signal, switch 42 is therefore also in phase with switch 20, and the modulating signal is not further delayed. However, during the second one-half time period of the carrier signal, switch 42 operates out of phase with switch 20 and the sample-and-hold circuit which is effected by switch 42, capacitor 46 and the unity gain amplifier 44, serves to delay the modulating signal by one-half period of the clock signal and therefore correct the imbalance previously described in reference to FIG. 2a.

FIG. 5a further shows the integrator 12 comprising an amplifier 48, and integrating capacitor 50. In parallel with the integrator 12 is circuit 51 comprising switch 52, switch 54 and capacitor 56. This switch-capacitor-switch combination serves to dissipate a small amount of the charge on capacitor 50 during each period of the clock signal to prevent DC saturation of the amplifier by making the amplifier "lossy."

The above described relationships between the frequency of the switching signals and the carrier signal associated with the network of FIG. 2a apply equally to FIG. 5a although a modified logic network $8^5$ generates the switching signals. The preferred logical representation of the switching signals, $S_n$, where n refers to the reference number of the respective switch illustrated in FIG. 5a, is as follows:

$S_{20} = \overline{CLOCK \oplus CXR}$
$S_{22} = S_{42} = S_{54} = \overline{CLOCK}$
$S_{26} = CLOCK \oplus CXR$
$S_{28} = S_{52} = CLOCK$ where CLOCK AND CXR are defined above.

FIG. 5b shows one of the preferred relationships between the carrier signal, clock signal and the switching signals hereinabove described in reference to FIG. 5a.

It is also desirable that the switching functions heretofore described be realized as non-overlapping. The switches to be closed must wait for the remainder of the switches previously closed to open. A preferred means for accomplishing the non-overlapping feature is by generating the above described switching signals and applying each such signal to a corresponding AND gate. The second input of each AND gate has a clock pulse applied to it whose frequency is twice the frequency of the clock signal, defined above. The signal generated by the AND gate is then applied to the particular switch that that switching signal controls. The non-overlapping switching function is assured because each of said switches is closed for only one-fourth of the clock signal time period.

The above description of the embodiments describes operation when the carrier signal is a square wave. If a better approximation to a sine wave carrier is required, shaping means increase and decrease the gain of the integrator 12 in steps so that modulation is effected by a step approximation to a sine wave. The gain of the integrator is directly proportional to the value of capacitor 24 and can be increased by sequentially switching other capacitors in parallel with it. The number of capacitors used in the shaping means determines the accuracy of the approximation to a sine wave.

FIG. 6a shows a preferred embodiment of the parallel capacitors and switches connected to capacitor 24. The network may be added to any of the hereinabove described switching networks. When switches 56, 58 and 60 are open, the gain of the integrator 12 is determined solely by the capacitor 24 within the switched-capacitor network $10^6$. Switch 56 closes and adds capacitance 62 to the system, switches 58 and 60 then close in sequence and add capacitances 64 and 66. The switches then open and remove the capacitances from the system in the reverse order. If the capacitances 24, 62, 64 and 66 are in the ratios of 1.000:1.848:1.414:0.765, respectively, then the third, fifth, seventh, ninth, eleventh and thirteenth harmonics of the carrier signal and the associated side bands thereof are suppressed.

FIG. 6a shows the timing diagram of the logic of the disclosed embodiment required to generate the switching signals $S_{56}$, $S_{58}$ and $S_{60}$ required to activate switches 56, 58 and 60, respectively, of FIG. 6a. The preferred logical representation of these switching signals generated by logic network $8^6$ may be determined from the accompanying truth table as shown in Table I; $F_1$ refers to the logic level of the carrier signal, and $F_2$, $F_4$ and $F_8$ refer to the logic levels of signals at two times, four times and eight times the frequency of the carrier signal.

There has been described novel apparatus and techniques for modulating a signal by another, while using only those circuit components suitable for large scale integration technology. It is evident that those skilled in the art may now make numerous uses and modifications of and departures from specific embodiments described herein without departing from the inventive concepts. Consequently, the invention is to be construed as embracing each and every novel feature and novel combination of features present in or possessed by the apparatus or techniques herein disclosed and limited solely by the spirit and scope of the appended claims.

TABLE I

| $F_1$ | $F_2$ | $F_4$ | $F_8$ | $S_{56}$ | $S_{58}$ | $S_{60}$ |
|---|---|---|---|---|---|---|
| 0 | 0 | 0 | 0 | 0 | 0 | 0 |
| 0 | 0 | 0 | 1 | 1 | 0 | 0 |
| 0 | 0 | 1 | 0 | 1 | 1 | 0 |
| 0 | 0 | 1 | 1 | 1 | 1 | 1 |
| 0 | 1 | 0 | 0 | 1 | 1 | 1 |
| 0 | 1 | 0 | 1 | 1 | 1 | 0 |
| 0 | 1 | 1 | 0 | 1 | 0 | 0 |
| 0 | 1 | 1 | 1 | 0 | 0 | 0 |
| 1 | 0 | 0 | 0 | 0 | 0 | 0 |
| 1 | 0 | 0 | 1 | 1 | 0 | 0 |
| 1 | 0 | 1 | 0 | 1 | 1 | 0 |
| 1 | 0 | 1 | 1 | 1 | 1 | 1 |
| 1 | 1 | 0 | 0 | 1 | 1 | 1 |
| 1 | 1 | 0 | 1 | 1 | 1 | 0 |
| 1 | 1 | 1 | 0 | 1 | 0 | 0 |
| 1 | 1 | 1 | 1 | 0 | 0 | 0 |

What is claimed is:

1. A switched-capacitor modulator for modulating a carrier signal with a modulating signal to develop a modulated signal, said modulator comprising:

switching means including, a first input terminal for application of the modulating signal, a second input terminal for application of a plurality of switching signals, an output terminal for providing a sampled modulating signal, a primary capacitive means having first and second plates, and a plurality of binary switches responsive to the switching signals for connecting said first and second plates to said input and output terminals;

logic means responsive to the carrier signal and a clock signal having a frequency of at least four times the frequency of said carrier signal and operative to generate said switching signals; and integrator means responsive to said sampled modulating signal and operative to provide the modulated signal.

2. The modulator of claim 1 in which said plurality of binary switches includes at least a first, second, third, and fourth switch and in which said first plate is connected to said first input terminal through said first switch and to common ground through said second switch, and in which said second plate is connected to said output terminal through said third switch and to common ground through said fourth switch.

3. The modulator of claim 2 in which said logic means develops switching signals during one one-half cycle of the carrier signal which alternate with the clock signal to close said first and fourth switches and open said second and third switches to charge said primary capacitive means with the modulating signal during one one-half period of the clock signal and open said first and fourth switches and close said second and third switches to discharge said primary capacitive means during the other one-half period of the clock signal.

4. The modulator of claim 3 in which said logic means develops switching signals during the remaining one-half cycle of the carrier signal which alternate with the clock signal to close said first and third switches and open said second fourth switches to charge said primary capacitive means with the modulating signal during one one-half period of the clock signal, and to open said first and third switches and close said second and fourth switches to discharge said primary capacitive means during the other one-half period of the clock signal.

5. The modulator of claim 4 in which said modulator further includes delay means including, an operational amplifier having an input and an output terminal, a fifth switch, and a storage capacitive means, said amplifier input terminal being connected to said first input terminal through said fifth switch and said amplifier output terminal being connected to said first switch, said storage capacitive means being connected between said amplifier input terminal and common ground, said fifth switch being responsive to the switching signal activating said fourth switch.

6. The modulator of claim 3 in which said switching means further includes a fifth switch responsive to a further switching signal for connecting said first input terminal to said second plate, and in which said logic means develops said further switching signal to open said fifth switch during said one one-half cycle of the carrier signal, and in which during the remaining one-half cycle of the carrier signal said logic means develops switching signals to close said second switch and open said first and fourth switches during the duration of said remaining one-half cycle, and alternatingly to close said fifth switch and open said third switch to charge said capacitive means with the modulating signal during one one-half period of the clock signal and open said fifth switch and close said third switch to discharge said capacitive means during the other one-half period of the clock signal.

7. The modulator of claim 3 in which said switching means further includes a fifth switch responsive to a further switching signal for connecting said output terminal to said first plate, and in which said logic means develops said further switching signal to open said fifth switch during said one one-half cycle of the carrier signal, and in which during the remaining one-half cycle of the carrier signal said logic means develops switching signals to close said fourth switch and open said second and third switches during the duration of said remaining one-half cycle, and alternatingly to close said first switch and open said fifth switch to charge said capactive means with the modulating signal during one one-half period of the clock signal and open said first switch and close said fifth switch to discharge said capacitive means during the other one-half period of the clock signal.

8. The modulator of claim 5, 6, or 7 in which said switching means further includes shaping means having a plurality of secondary capacitive means and a plurality of secondary switches responsive to secondary switching signals, each secondary capacitive means being connected through one of said secondary switches across said primary capacitive means, and in which said logic means develops said secondary switching signals to activate said secondary switches at frequencies which are integer multiples of the frequency of the carrier signal.

* * * * *